(12) United States Patent
Hanafi et al.

(10) Patent No.: US 6,337,497 B1
(45) Date of Patent: *Jan. 8, 2002

(54) COMMON SOURCE TRANSISTOR CAPACITOR STACK

(75) Inventors: Hussein Ibrahim Hanafi, Goldens Bridge; Arvind Kumar, New York; Matthew R. Wordeman, Mahopac, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/858,486

(22) Filed: May 16, 1997

(51) Int. Cl.⁷ ............................................. H01L 31/119
(52) U.S. Cl. .................. 257/306; 257/310; 257/330; 345/182
(58) Field of Search ............................ 257/296, 302, 257/303, 306, 310, 329, 330, 911, 920; 365/149, 182

(56) References Cited

U.S. PATENT DOCUMENTS

| | | | |
|---|---|---|---|
| 4,630,088 A | * 12/1986 | Ogura et al. ................ 357/23.6 |
| 5,001,526 A | 3/1991 | Gotou | |
| 5,072,269 A | 12/1991 | Hieda | |
| 5,214,296 A | * 5/1993 | Nakata et al. ................ 257/71 |
| 5,229,964 A | * 7/1993 | Yamauchi .............. 365/189.01 |
| 5,298,780 A | 3/1994 | Harada | |
| 5,334,548 A | 8/1994 | Shen et al. | |
| 5,390,144 A | * 2/1995 | Susuki ........................ 365/149 |
| 5,416,350 A | * 5/1995 | Watanabe .................... 257/330 |
| 5,460,994 A | 10/1995 | Kim | |
| 5,480,838 A | * 1/1996 | Mitsui ........................ 437/203 |
| 5,574,299 A | 11/1996 | Kim | |
| 5,578,850 A | * 11/1996 | Fitch et al. ................. 257/329 |
| 5,929,477 A | * 7/1999 | Burns, Jr. et al. ........... 257/306 |

FOREIGN PATENT DOCUMENTS

| | | |
|---|---|---|
| JP | 6-23270 | 8/1994 |
| JP | 7-58218 | 3/1995 |
| JP | 9-92793 | 4/1997 |

* cited by examiner

Primary Examiner—Sara Crane
(74) Attorney, Agent, or Firm—Scully, Scott, Murphy & Presser; Marian Underweiser

(57) ABSTRACT

New arrangement of a vertical field effect transistor and a capacitor together forming a memory cell which in turn may be the basic building block of a memory chip, such as a very high density DRAM. The capacitor's first electrode is connected to the drain of the transistor. The transistor's source is connected to the sources of other transistors, the gate is connected to a word line, and the second electrode of said capacitor is connected to a bit line.

3 Claims, 5 Drawing Sheets

COMMON SOURCE TRANSISTOR CAPACITOR STACK

TECHNICAL FIELD

The present invention relates to a novel arrangement of an FET, serving as access device, and a capacitor, both together forming a storage cell of a memory, e.g. a Dynamic Random Access Memory (DRAM).

BACKGROUND OF THE INVENTION

In order to be able to make memory chips, logic devices and other kind of devices of high integration density, one has to find a way to further scale down certain components thereof.

Vertical field effect transistors (FETs) play an important role in different such devices. They are of particular importance in DRAMs. Another important building block of memory devices are the capacitors which actually store the information. The FETs usually serve as access devices for these capacitors. By application of appropriate signals to the word lines and bit lines of a storage cell, the respective FET can be switched to allow the charging of the corresponding capacitor.

In order to achieve a high packing density necessary for Gbit DRAM memory, it is crucial that a minimum memory cell size be maintained. This minimum cell size typically is on the order of $4F^2$, where F is the minimum lithographic line-width.

It is an object of the present invention to provide a way for the high density integration of access devices and capacitors, e.g. for use in a memory device.

It is another object of the present invention to provide an improved FET/capacitor arrangement which is suited for high density integration.

SUMMARY OF THE INVENTION

The present invention concerns a novel arrangement of a vertical transistor and a capacitor (e.g. a stack capacitor), and a method for operation of such an arrangement. This arrangement is well suited as memory cell of a memory device, for example.

The novel arrangement comprises an FET with a vertically arranged channel and a capacitor being formed on top of the FET's uppermost electrode, e.g. the drain. The capacitor is interconnected with this uppermost electrode. The source electrode of the FET is coupled to a common source voltage $V_{DD}$, for example. The gate electrode is linked to a word line and the capacitor's upper electrode is connected to the bit line.

In a preferred implementation, the gate electrodes (comprising polysilicon, for example) directly connect all devices along a common word line or row line.

This new arrangement requires a novel operation scheme for the storing and reading of information, as will be described in the detailed description.

In an alternative embodiment of the present invention the doped region serving as drain and the doped region serving as source are interchanged. Such a structure can be referred to as common drain transistor capacitor stack.

The integration of a vertical FET serving as access transistor with a storage capacitor stacked on top of it allows to realize very small memory cells.

It is an advantage that the inventive cells can be made using processing steps which are compatible with current semiconductor manufacturing processes.

DESCRIPTION OF THE DRAWINGS

The invention is described in detail below with reference to the following schematic drawings. These drawings are not drawn to scale.

DETAILED DESCRIPTION OF THE PRESENT INVENTION

In the present context mainly DRAM memories and DRAM memory cells will be addressed. It is to be understood that the novel FET/capacitor arrangement presented herein can also be used in other devices such as logic devices (e.g. shift registers) for example.

Polysilicon (also referred to as polycrystalline silicon) can be formed using chemical vapor deposition (CVD), or low pressure chemical vapor deposition (LPCVD), as well as other known processes. Polysilicon is a solid composed of a myriad of small single crystal regions.

The expression memory is meant to cover any kind of memory device formed on, or in a substrate. Such a memory may comprise different memory cells and other kind of circuits.

When referring to a "sidewall", any kind of surface of a semiconductor structure is meant which is sloped with respect to the plane of the substrate of said semiconductor structure. Of particular importance are sidewalls which are perpendicular with respect to said substrate's plane.

A vertical FET, as used herein, is a three-dimensional transistor that is formed on the sidewalls of a pillar. The areal dimension of this pillar may be lithographically defined and the pillar may comprise silicon, for example. In a vertical FET, the current flows vertically along the sidewalls of the pillar and is controlled by the polysilicon gate which encircles the pillar. The gate length is adjusted by the pillar height. The vertical FET is a natural choice because of its small area foot-print, as well as its potential for easy scalability, as addressed in co-pending U.S. patent application with application Ser. No. 08/749,748, filed on Nov. 15, 1996. This U.S. patent application is herewith incorporated by reference. The utilization of the vertical dimension for the transistor channel eliminates short-channel effects as a constraint while still allowing areal scaling. Any kind of vertical FET is suited for use in connection with the present invention, and the described FETs are examples only.

As will be seen later, the poly gates are deposited uniformly around the pillars of the the vertical FETs. Due to this, the spacing between adjacent devices (memory cells) along the bit lines perpendicular to the word lines must be slightly greater than F (namely F+f, where f preferably is on the order of about 0.1F) to ensure that the gates are not shorted in this direction. It is obvious that f may be bigger, but by choosing a bigger f, the integration density will be reduced.

In the following, the uppermost electrode of the vertical transistors is the drain. Likewise, the source may be the uppermost electrode.

Figure 1A:
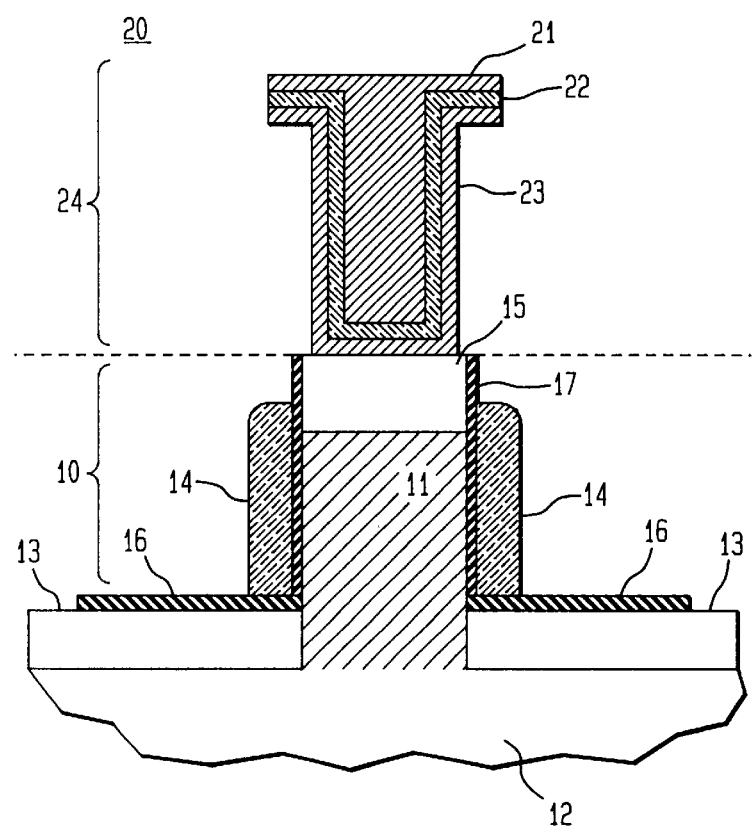
FIG. 1A Is a schematic cross-section of a first embodiment of the present invention.
Figure 1B:
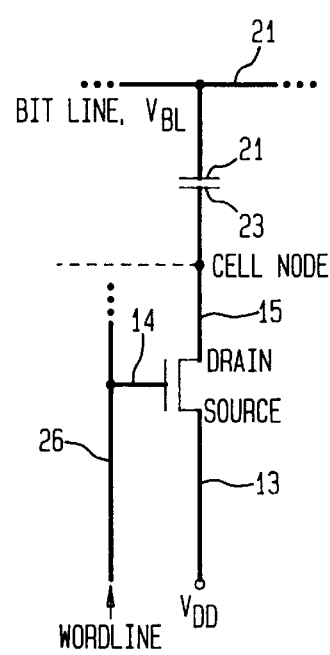
FIG. 1B Is a block diagram of the new arrangement shown in FIG. 1A.

The present invention is now described in connection with FIGS. 1A and 1B. In FIG. 1A, a first embodiment of the present invention is shown. In FIG. 1B, it is illustrated how the two basic building blocks of the first embodiment are arranged and coupled to each other.

In FIG. 1A, a schematic cross-sectional view of a vertical FET 10 is shown on top of which a capacitor 24 is situated. In the following, the combination of an FET with a capacitor is referred to as memory cell 20, or simply cell.

The FET 10 has a pillar-like shape. The pillar may have a circular, square or rectangular cross-section in the plane of the substrate 12. Substrate 12 may be silicon, for example.

The gate channel 11 is the area between the source 13 and drain electrodes 15 of FET 10. As can be implanted into the substrate 12 and the top of the pillar to form the source 13 and drain 15, respectively. Well suited for n-type doping are: P, As and Sb, for example. The channel 11 is selectively made conductive or non-conductive to effect the desired operation. The pillar serving as gate channel consists of the same material as the substrate 12 (e.g. silicon). It may be p-doped. Well suited for p-type doping are: B, In and Ga, for example. A well defined gate channel 11 and polysilicon gate layer 14 are crucial for the operation of such an FET. However, as the desired size of such channels and the adjacent polysilicon layer get increasingly smaller, inaccuracies of the manufacturing process can easily cause the small channel 11 to be short-circuited or leaky, rendering the respective FET 10 and eventually the whole memory cell 20 or even the DRAM—of which the memory cell 20 is only one part—non-functional. In addition, the dimensions of the channel 11 and the polysilicon layer 14 control the electrical characteristics of the device. The performance of an FET depends very much on the geometry of the device, the doping profile and quality of the materials proximate the surfaces and so forth. This requires that the dimensions of the polysilicon gate conductor 14 are controlled precisely. As mentioned above, the process described in the co-pending U.S. patent application, with application Ser. No. 08/749,748, is well suited to make a vertical FET.

Gate Induced Drain Leakage (GIDL) in a vertical FET may be reduced by employing a lightly doped drain (LDD). Such an LDD provides for a vertical grading of the junction profile in the vertical FET.

As shown in FIG. 1A, the polysilicon gate layer 14 is separated from the channel 11 by a gate oxide 17. Another oxide layer 16 is situated between the source 13 and the polysilicon gate layer 14 providing for an isolation of source and gate. The gate oxide 17 is arranged such that also the drain 15 is separated from the polysilicon gate layer 14.

A stack capacitor 24 is formed on top of the FET 10. This capacitor comprises an upper electrode 21 and a lower electrode 23. TaSiN may be used as lower electrode 23, and TiN and Pt may be used as upper electrode 21. The upper electrode 21 may likewise comprise a layered structure, e.g. comprising a Pt layer and a TiN layer. A dielectric layer 22 is situated between these two electrodes. BSTO (barium Strontium Titanate) may be used as dielectricum. In the present embodiment, the lower electrode 23 is directly connected to the FET's drain 15. It may likewise be connected to the FET by means of a via or stud or any other interconnection. Such a stud may be made of W, for example.

The novel arrangement of the FET 10 and capacitor 24 is illustrated in FIG. 1B. As shown in this Figure, a supply voltage $V_{DD}$ is applied to the source 13 of the FET 10. According to the present invention, the sources of adjacent FETs are all common and connected to the $V_{DD}$ supply voltage. One may either connect all sources to one and the same $V_{DD}$ power supply, or the FETs may be grouped into smaller arrays to each of which a separate power supply is assigned.

The gate 14 of the FET 10 is connected to the word line 26 or a row line. As addressed in connection with FIG. 6, the gates may form the word line if being formed close enough to each other. The FET's drain 15 is directly coupled to the lower electrode 23 of the capacitor 24. The point of interconnection is also referred to as cell node. The upper electrode 21 is connected to the cell's bit line or a column line, or is itself the bit line.

The array suitability for very high density DRAMs, for example, is obtained by utilizing the novel and inventive common source configuration shown in FIG. 1B, for example. In this configuration, a new circuit arrangement of a vertical FET and capacitor is made use of. The capacitor and FET are interchanged compared to conventional approaches. This arrangement allows the placement of the stack capacitor on top of the access vertical device (FET) with no increase in array area while facilitating a very simple process for the production of very high density DRAMs, for example.

Figure 2:
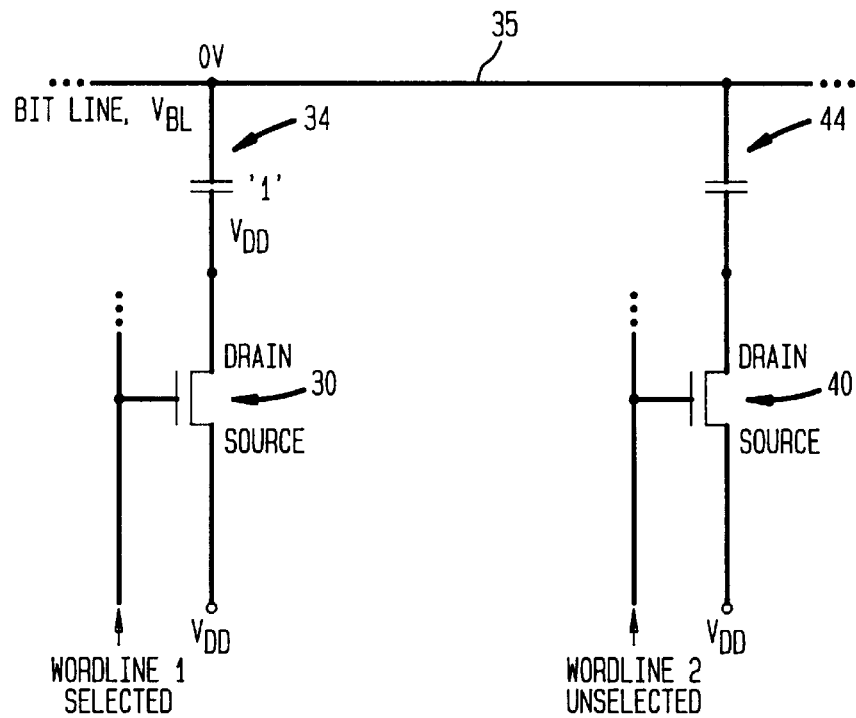
FIG. 2 Is a block diagram of two memory cells, according to the present invention, the memory cell on the left hand side being selected in order to write a '1' into the respective capacitor.

In the following, the operation of an inventive common source memory cell is addressed. Details are illustrated in FIG. 2. As already mentioned, the supply voltage $V_{DD}$ is applied to the source nodes. To write a logic '1' in a cell (i.e. a cell voltage of $V_{DD}$), the bit line 35 is first driven to 0 volts ($V_{BL}$=0V). The access transistor 30 is now fully turned on allowing the capacitor 34 to be charged. Only transistor 30 is turned on because this transistor was selected through the respective word line 1. Transistor 40 is not turned on. By selection of an appropriate word line (word line 1 in the present example) the full voltage $V_{DD}$ can be stored across the corresponding capacitor 34. The written level is now stored by turning off the access transistor 30. Please note that a '1' is stored only in the memory cell on the left hand side which was selected via the respective word line. In the illustrated example, word line 1 was selected and a voltage $V_{DD}$ is written and stored in capacitor 34. Since word line 2 was not selected, the transistor 40 is not turned on and no voltage $V_{DD}$ is written into capacitor 44.

Figure 3:
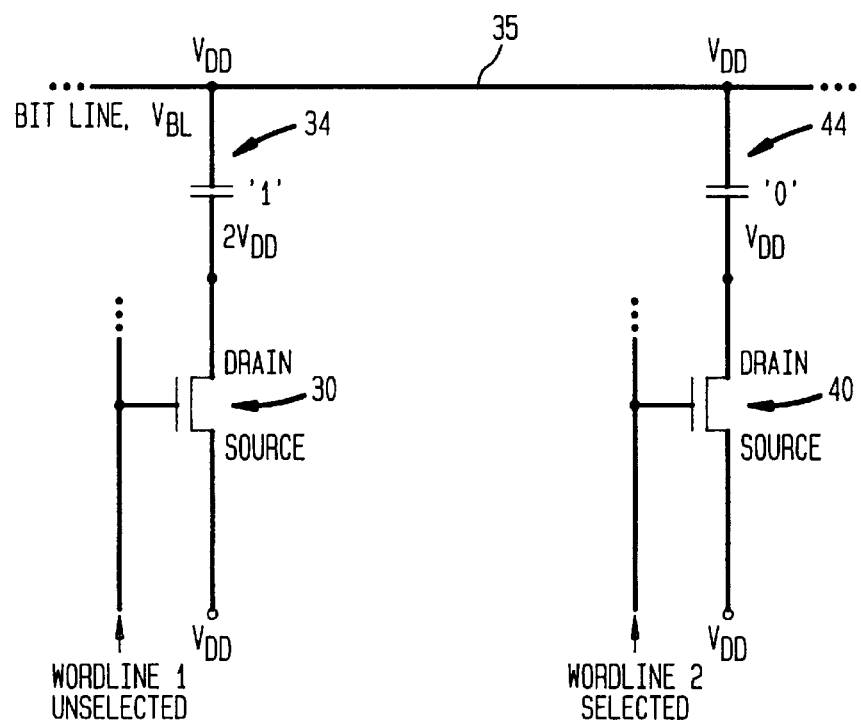
FIG. 3 Is a block diagram of two memory cells, according to the present invention, the memory cell on the right hand side being selected in order to write a '0' into the respective capacitor. The effect on the memory cell on the left hand side is also shown.

To write a logic '0' in a memory cell (i.e. a cell voltage of 0 Volts), the bit line 35 is driven to $V_{DD}$ (i.e. $V_{BL}=V_{DD}$), as illustrated in FIG. 3. The access transistor 40 is turned on allowing the storage of 0 Volts ($V_{DD} - V_{DD}$) across the capacitor 44. During this operation, the cell node of an unselected cell (transistor 30 and capacitor 34, for example) with a voltage $V_{DD}$ stored, will be booted in voltage to about $2V_{DD}$, as shown on the left hand side of FIG. 3. Please note that a '1' remains stored in the cell on the left hand side. Please also note that due to the vertical grading nature of the junction profile in a vertical FET (see FET 10 in FIG. 1A, for example), Gate Induced Drain Leakage (GIDL; drain to substrate junction leakage due to gate modulated high field across jot) in an access transistor is minimized allowing proper cell operation in this unique common source scheme, according to the present invention.

Figure 4A:
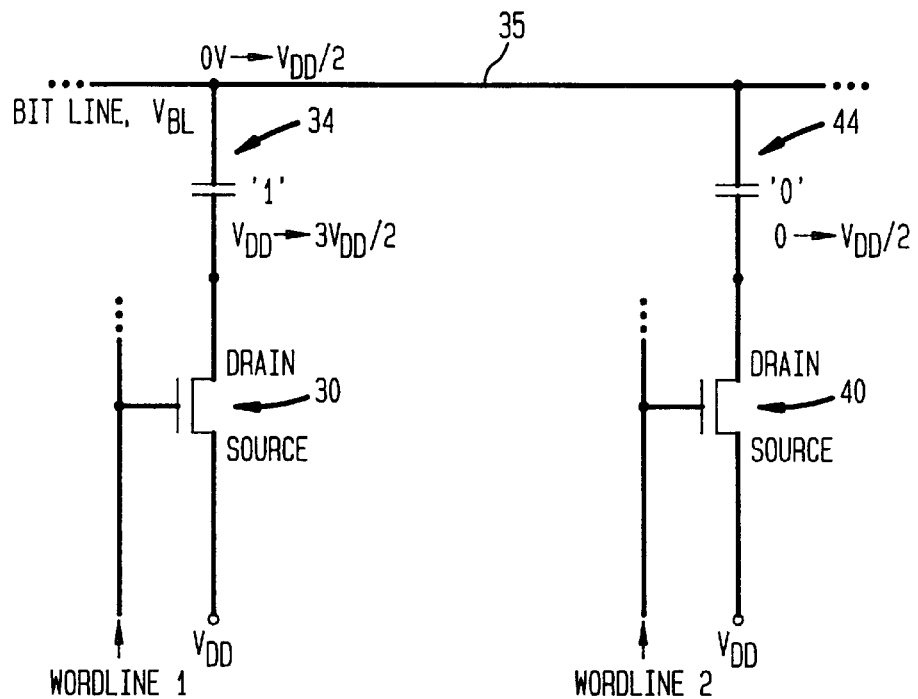
FIG. 4A Is a block diagram of two memory cells, according to the present invention, the stored information being read of either cell by selecting the appropriate word line. In the present example, the bit line is precharged from 0V to $V_{DD}/2$ before word line selection.

For the reading of a cell (see FIGS. 4A and 4B), there are two different approaches depending on the previous state of the bit line. As shown in FIG. 4A, the bit line 35 may be pre-charged from 0V to a $V_{DD}/2$ level (i.e. $V_{BL}=V_{DD}/2$). The access transistor 30 is now turned on allowing the stored cell charge to cause a change in the bit line voltage. This change in the bit line voltage can be sensed. Sensing may be done by means of comparison with a second bit line pre-charged to a $V_{DD}/2$ voltage, as for example described in "½-$V_{DD}$ bit-line sensing scheme in CMOS DRAMs", IEEE JSSC Vol. SC19, No. 4, pp. 451–454, April 1984.

Figure 4B:
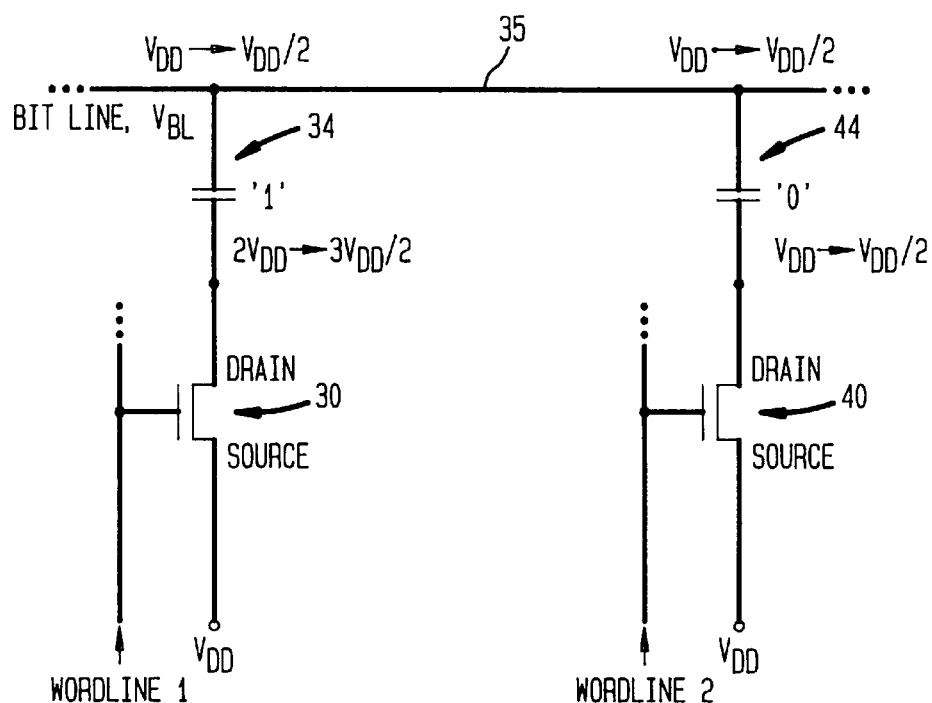
FIG. 4B Is a block diagram of two memory cells, according to the present invention, the stored information being read of either cell by selecting the appropriate word line. In the present example, the bit line is precharged from $V_{DD}$ to $V_{DD}/2$ before word line selection.

If the bit line 35 is at a voltage $V_{DD}$, it has to be pulled down to $V_{BL}=V_{DD}/2$, as illustrated in FIG. 4B, in order to be able to read out the stored information. The access transistor 30 is now turned on allowing the stored cell charge to cause a change in the bit line voltage. This change in the bit line voltage can be sensed. Please note, that independent of whether the bit line was previously at 0V or at $V_{DD}$, the '1' stored in the cell on the left hand side as well as the '0' stored in the cell on the right hand side can be sensed.

Now that the basic building block—a memory cell comprising the inventive arrangement of at least one vertical FET and a stack capacitor—has been addressed, two examples of arrays comprising such memory cells (see FIGS. 5 and 6A, 6B) are described.

Figure 5:
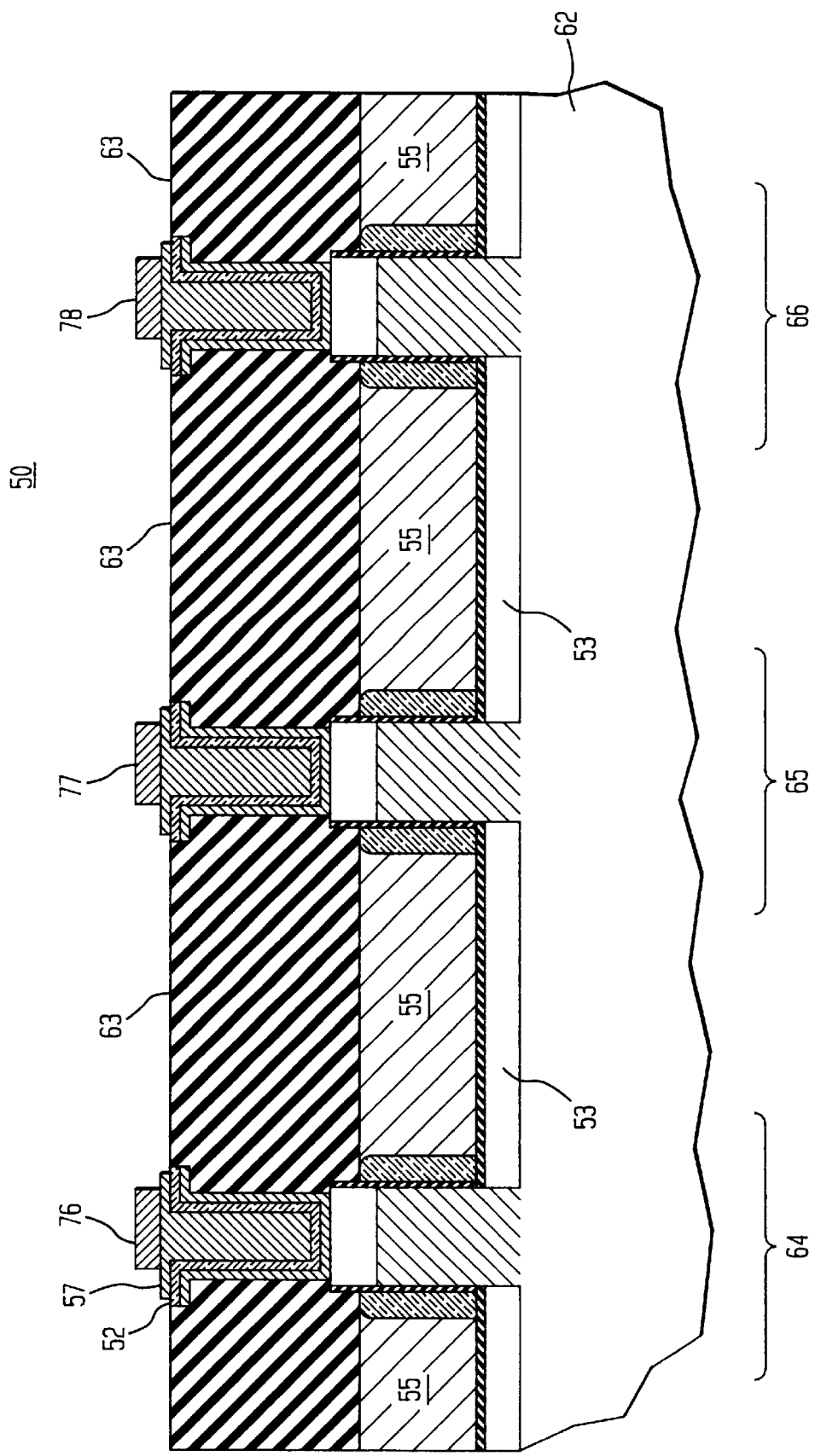
FIG. 5 Is a schematic cross-section of an array of memory cells in the word line direction (similar to those of FIG. 1A), according to the present invention.

In FIG. 5, a cross-section of part of a memory array 50 is shown. The memory array is cut parallel to a word line. Several memory cells 64–66 are formed in substrate 62 (e.g. consisting of silicon). Adjacent memory cells (64 and 65, 65 and 66) have common sources 53. In an alternative embodiment adjacent memory cells may have separate sources instead of common sources. As shown in FIG. 5, the space between the memory cells is filled with a conductive material 55 serving as common word line. In order to interconnect adjacent cells along one and the same word line, the conductive material 55 has to be provided. This requires deposition and lithography steps. On top of the conductive material an isolating material 63 is situated. Well suited are oxides, for example. Likewise, the memory cells could be placed closer such that the polysilicon gates of adjacent FETs provide for the interconnection (see FIG. 6A). In such a case there would be no need for the conductive material 55.

Each memory cell is connected to a bit line. In the present example, memory cell 64 is connected to bit line 76, cell 65 to line 77 and cell 66 to line 78. As can be seen, the bit lines are perpendicular with respect to the word lines. These bit lines can be formed directly on top of the upper electrode 57 of the capacitor. Likewise, the upper electrodes may form the bit lines.

Figure 6A:
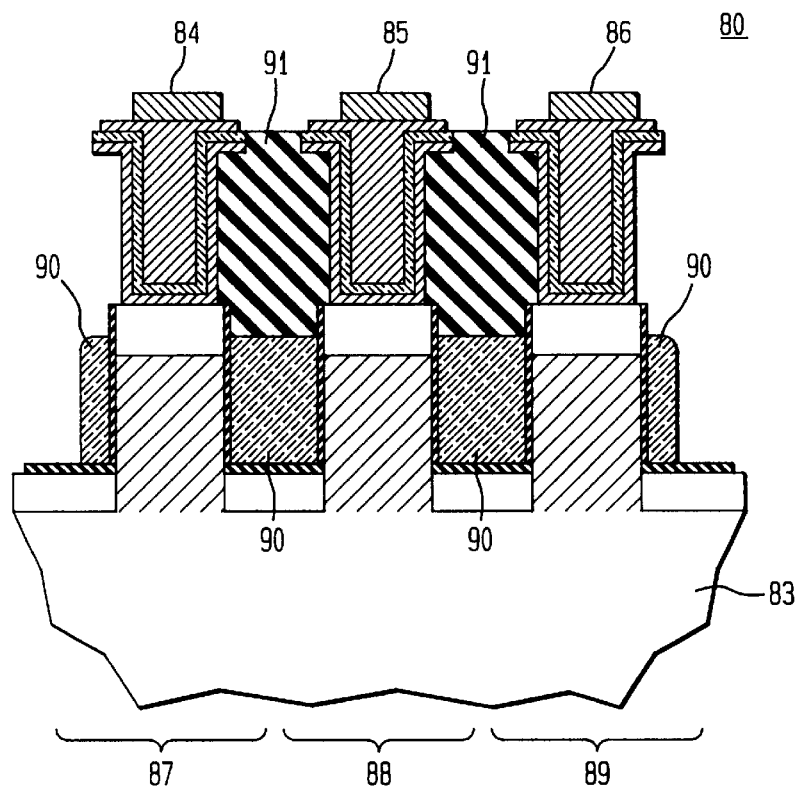
FIG. 6A Is a schematic cross-section of another array of memory cells in the word line direction, according to the present invention. Please note that in this embodiment the gate electrodes of adjacent FETs are connected forming a common word line.
Figure 6B:
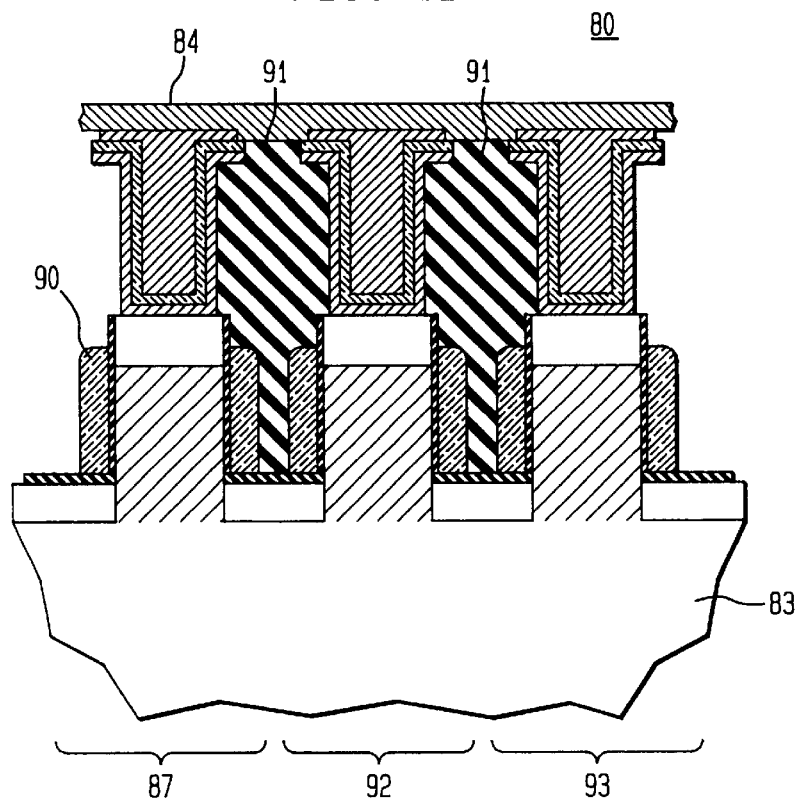
FIG. 6B Is a schematic cross-section of the array of FIG. 6A in the bit line direction. Please note that in this embodiment the gate electrodes of adjacent FETs are not connected.

Two cross-section of another array 80 are illustrated in FIGS. 6A and 6B. The cross-section of FIG. 6A is parallel to the word line, whereas the cross-section of FIG. 6B is parallel to a bit line. As shown, the array 80 comprises several memory cells 87–89 and 92,93 formed on a substrate 83. The polysilicon gates 90 of the cells 87–89 form the word line (see FIG. 6A). Three bit lines 84, 85, 86 are formed on top. In the present embodiment the distance between adjacent memory cells within one word line is F (where F is the minimum lithographic line width) to ensure that adjacent gate electrodes 90 are interconnected (see FIG. 6A), whereas the distance between two memory cells, e.g 87 and 92, of adjacent but independent word lines is chosen to be F+f (see FIG. 6B). f may be about 0.1F, for example. As in case of FIG. 5, there is an insulating material 91 situated on top of the word line 90 between the cell's capacitors. In the present embodiment, the same insulating material 91 is also used to fill the gap between cells of adjacent word lines, as shown in FIG. 6B. This insulating material 91 used to fill the gaps between word lines is not really necessary, if the bit line 84 would be arranged and structured differently. Please note that the array of FIGS. 6A and 6B has the advantage, besides other advantages, that no separate deposition and lithography steps for the formation of a word line interconnection are required. It is to be noted that the word lines and bit lines are not in electrical contact with each other.

In the following a exemplary manufacturing process is described which is suited to make an array, according to the present invention.

After p-well implantation of a substrate, a nitride mask may be used to define the pillars later serving as vertical channels. These pillars are then formed in the substrate by reactive—ion etching using a HCl—$Cl_2$—$N_2$—plasma, for example. The channel length is defined by the pillar height. A channel length of about 250 nm requires a pillar being about 350 nm high, and a channel of about 450 nm requires a pillar being about 550 nm in height. Following a sacrificial oxidation step to remove plasma related damage and a LOCOS (local oxidation of silicon) or an STI (shallow trench isolation) isolation step, an As implant is used to form the common source and isolated drains for the cells. The dose of As may be $2 \times 10^{15}$ cm$^{-2}$. It is an advantage of this process that the source implantation is self aligned to the pillars. In a next step the structure is then annealed. This can be done at 1050° C. for 30 seconds in $N_2$ atmosphere. After stripping the sacrificial oxide, the gate oxide is thermally grown. This gate oxide may be a few nanometers thick. Preferably, its thickness is between 5 and 7 nm. In-situ As doped polysilicon is deposited using an LPCVD technique. The polysilicon word lines (gates) are now formed by self aligned etching using $Cl_2$—$O_2$ silicon etch, for example. A gate polysilicon thickness (F/2, e.g. 100 nm) is sufficient to fill the F (e.g. 200 nm) gaps between adjacent cells in the word line direction, but insufficient for filling the gaps (F+f, e.g. 300 nm) between pillars of adjacent word lines. The polysilicon gates serving as word lines are reactive-ion etched until the top of the gate electrodes lies about 100 nm below the top of the pillar. By means of the above process, continuous word lines are formed by those pillars whose polysilicon gate electrodes interconnect. Planarization can be achieved by chemical mechanical planarization (CMP) of oxide or a BPSG (Boron-Phosphorous Silicate Glass) deposited layer, for example. A capacitor is formed on each pillar over the drain. Each capacitor has a lower electrode, a dielectricum and an upper electrode. The upper electrode may be connected to a bit line or may form part of the bit line.

The capacitor shown and discussed herein can be replaced by any kind of other capacitor suited to be stacked on top of the access transistor underneath. In order to ensure sufficient capacitance of such a capacitor, usually capacitors are employed which are formed in a trench (like the one illustrated in FIG. 1A), or on a ridge or pillar. By increasing the effective area of the capacitor's electrodes the capacitance to surface area ratio can be increased. In connection with the present invention planar-type capacitors as well as three dimensional stack-type and trench-type capacitors can be employed.

A process suited for making vertical FETs is described in co-pending U.S. patent application, with application Ser. No. 08/749,748, mentioned above. The process described in this US patent application allows to precisely define the size and shape of the polysilicon gate conductor being an essential part of such an FET. There are other ways to make vertical FETs. Conventional semiconductor processing steps can be used to realize the inventive structures.

In an alternative embodiment, the drains of adjacent memory cells (instead of the sources) can be interconnected. In such an embodiment, the FET's source is connected to the lower electrode of the capacitor. Such an alternative embodiment looks the same as the one shown in FIG. 1A, with the difference that source and drain are interchanged. I.e., in the alternative embodiment the source region is on top of the vertical pillar and the drain region is located at the bottom of the pillar. Such a structure can be referred to as common drain transistor capacitor stack.

What is claimed is:

1. Method for storing a bit in a memory device comprising at least one cell which has a vertical field effect transistor with a source, drain and gate, said vertical field effect transistor is formed on a semiconductor substrate and further comprising a pillar serving as a gate channel between said source and drain, said gate channel being continuous with said substrate and being composed of the same material as the substrate, and a capacitor with a first and second electrode, said capacitor being situated on top of said pillar and said electrode being interconnected with said drain, said source being connected to a supply voltage, said second electrode being connected to a bitline, and said gate being connected to a word line, said method comprising the steps of:

driving said bitline to 0 volts; and selecting said cell by applying a voltage to said word line such that said capacitor is charged and a voltage of about said supply voltage is built up between its first and second electrodes.

2. Method for removing a bit stored in a memory device comprising at least one cell which has a vertical field effect transistor with a source, drain and gate, said vertical field effect transistor formed on a semiconductor substrate and further comprising a pillar serving as a gate channel between said source and drain, said gate channel being continuous with said substrate and being composed of the same material as the substrate, and a capacitor with a first and second electrode, said capacitor being situated on top of said pillar and said first electrode being interconnected with said drain, said source being connected to a supply voltage, said second electrode being connected to a bit line, said gate being connected to a word line, and said bit being stored in form of a voltage of about said supply voltage between said first and second electrodes, said method comprising the steps:

driving said bit line from 0 volts to a voltage about the same as said supply voltage; and selecting said cell by applying a voltage to said word line such that said capacitor is discharged.

3. Method for reading out a bit stored in a memory device comprising at least one cell which has a vertical field effect transistor with a source, drain and gate, said vertical field effect transistor formed on a semiconductor substrate and further comprising a pillar serving as a gate channel between said source and drain, said gate channel being continuous with said substrate and being composed of the same material as the substrate, and a capacitor with a first and a second electrode, said capacitor being situated on top of said pillar and said first electrode being interconnected with said drain, said source being connected to a supply voltage, said second electrode being connected to a bit line, said gate being connected to a word line, and said bit being stored in form of a voltage of about said supply voltage between said first and second electrodes, said method comprising the steps:

driving said bit line to a voltage of about half of said supply voltage;

turning said transistor on by applying a voltage to said word line such that said voltage stored between said first and second electrodes causes a change in voltage on said bit line; and sensing said change.

* * * * *